US005355134A

United States Patent [19]

Kasuga et al.

[11] Patent Number: 5,355,134

[45] Date of Patent: Oct. 11, 1994

[54] DIGITAL TO ANALOG CONVERTER CIRCUIT

[75] Inventors: Nobuyuki Kasuga; Akinori Maeda, both of Hachioji, Japan

[73] Assignee: Hewlett-Packard Company, Palo Alto, Calif.

[21] Appl. No.: 801,545

[22] Filed: Dec. 2, 1991

[30] Foreign Application Priority Data

Nov. 30, 1990 [JP] Japan ..... 2-340810

[51] Int. Cl.[5] ..... H03M 1/66

[52] U.S. Cl. ..... 341/144

[58] Field of Search ..... 341/144, 131, 118, 146, 341/153, 154

[56] References Cited

U.S. PATENT DOCUMENTS 4,591,832 5/1986 Fling et al. ..... 341/144 X
4,972,188 11/1990 Clement et al. ..... 341/131
5,008,674 4/1991 DaFranca et al. ..... 341/144 X

FOREIGN PATENT DOCUMENTS 2-37818 2/1990 Japan .

OTHER PUBLICATIONS

*In re Lincoln and Henriksen,* 66 USPQ 240.
Hewlett-Packard Journal, "An Arbitrary Waveform Synthesizer for DC to 50 Mz", Apr. 1988, vol. 69-77, by Roland Hassun and Albert W. Kovalick.
Hewlett-Packard Journal, "Analog Output System Design for Multifunction Synthesizer", Feb. 1989, vol. 66-69, by Thomas Higgins, Jr.

*Primary Examiner*—Sharon D. Logan

[57] ABSTRACT

The present invention provides a digital to analog converter circuit comprising a digital to analog converter portion for accepting digital inputs indicative of a signal level and for producing an analog output indicative of a difference in signal level between one digital input and a previous digital input. An integrator is coupled to the digital to analog converter portion for integrating the analog output thereby producing a substantially smooth waveform. The digital to analog converter portion may comprise a plurality of current source type digital to analog converters having a common output terminal and the integrator may comprise an integrating capacitor. In such an embodiment the output from the common output terminal is indicative of a signal level difference determined by at least two of the digital inputs.

9 Claims, 5 Drawing Sheets

10
20
30
D(n)
DAC1
$I_1$
$I_1 - I_2$
$V_C$
C
D(n-1)
DAC2
$I_2$
CLK

DIGITAL TO ANALOG CONVERTER CIRCUIT

FIELD OF THE INVENTION

The present invention relates to a digital to analog (D/A) converter circuit capable of producing a smooth waveform.

BACKGROUND OF THE INVENTION

In recent years, various digital apparatuses such as compact disk players and digital audio tape recorders have been rapidly developed as commercial products. With this trend, techniques for converting digital signals into analog signals have become indispensable. DACs (digital to analog converters) are used for such conversion.

Where a digital amount is converted into an analog amount by a DAC, the analog voltage or current delivered from the DAC in response to the input assumes a "staircase" waveform which varies in a stepwise fashion.

For example, when a sinusoidal wave is produced, using the above-described DAC, digital codes of normally 8 to 16 bits which indicate displacements of the sinusoidal wave are applied to the DAC in response to every clock applied for conversion. The output waveform is a staircase wave S as shown in FIG. 1. The duration of each step of this staircase wave S is determined by the clocks described above.

As the ratio of the frequency of the clocks to the frequency of the desired sinusoidal waveform increases, the staircase wave S approximates more closely the actual sinusoidal wave F. However, the waveform S still maintains the staircase condition and, therefore, unwanted spurious signals are produced at and around the clock frequency and its harmonic frequencies.

Accordingly, it has been the common practice to connect a smoothing filter, or an analog filter, with the output of the DAC to smooth the staircase wave S, whereby the output waveform is made to approximate the sinusoidal waveform F. Where a desired output waveform is obtained, a filter having a sharp cut-off characteristic may be needed. However, it is not always practical to realize a filter having a sharp-cut-off characteristic. The prior art filter meeting these sharp cut-off requirements cannot always satisfy the phase and the gain characteristics of the passband. Additionally, the number of components is increased further to accommodate a sharp cut-off frequency.

Furthermore, where the frequency of the output sinusoidal wave is varied, filters having different cutoff frequencies are needed.

SUMMARY OF THE INVENTION

The present invention has been proposed to solve the foregoing problems. It is an object of the present invention to provide a D/A converter circuit which can produce a smooth output waveform without requiring a sharp cut-off frequency and in some cases eliminating the need for a filter.

The above object is achieved by the present invention which provides a digital to analog converter circuit comprising a digital to analog converter portion for accepting digital inputs indicative of a signal level and for producing an analog output indicative of a difference in signal level between one digital input and a previous digital input. An integrator is coupled to the digital to analog converter portion for integrating the analog output thereby producing a substantially smooth waveform. In a preferred embodiment, the digital to analog converter portion comprises a plurality of current source type digital to analog converters having a common output terminal and the integrator comprises an integrating capacitor. In such an embodiment the output from the common output terminal is indicative of a signal level difference determined by at least two of the digital inputs.

In accordance with the present invention, a voltage output DAC, such as a ladder resistance DAC, can be used as the DAC in the D/A converter portion, as well as a current output DAC.

The operation of the present invention is described by taking a D/A converter circuit using a current output DAC as an example. For this example, assume that a digital code of 8 to 16 bits is applied to the D/A converter portion of a D/A converter circuit in response to each clock applied for conversion.

The D/A converter portion successively produces analog outputs in response to clocks applied for conversion. Each analog output is determined from an analog current value corresponding to the digital code and from an analog current value corresponding to at least one digital input previously applied.

These analog outputs are delivered to an integrating means. The result of the integration performed by the integrating means is generally a continuous waveform consisting of straight lines having different differential coefficients. This waveform is the output from the D/A converter circuit via the next stage of circuit which, for example, comprises an amplifier. Also, spurious signals are reduced greatly, even without the use of a filter.

The difference between the analog current value corresponding to the digital input in response to the present clock and the analog current value corresponding to the digital input in response to the immediately previous clock is taken as the analog output, then the result of the integration performed by the integrating means, or the integration output, takes a shape obtained by connecting the successive corners of the staircase waveform produced from the prior art DAC. The frequency spectrum of this output has signal characteristics similar to the signal characteristics obtained where a filter is applied to the output of a DAC.

BRIEF DESCRIPTION OF THE DRAWINGS

The present invention will be better understood, and its numerous objects and advantages will become apparent by reference to the following detailed description of the invention when taken in conjunction with the following drawings, in which.

DETAILED DESCRIPTION OF THE PRESENT INVENTION

Figure 2:
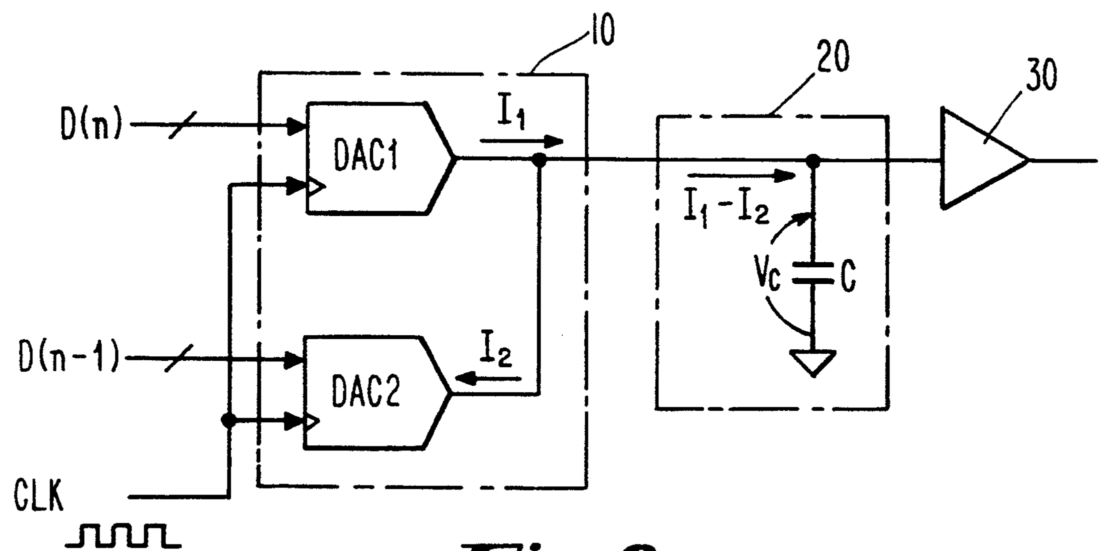
FIG. 2 is a diagram of a converter circuit according to the invention.

FIG. 2 is a circuit diagram showing one embodiment of the D/A converter circuit according to the invention. The illustrated D/A converter circuit has a D/A converter portion 10 consisting of a pair of DACs 1 and 2 producing output currents. These DACs 1 and 2 have almost identical characteristics including gain and offset. However, the currents produced from them in response to digital inputs are opposite in polarity. In particular, the DAC 1 delivers an analog current I1 corresponding to each input digital value. The DAC 2 produces a current ~I2 which corresponds in magnitude to each input digital value but is opposite in polarity.

The most recent digital input D(n) and digital input applied in the past D(n−1) are successively applied to the DACs 1 and 2. In addition, a timing signal CLK is applied to DAC 1 and DAC 2.

An integrating means 20 shown as an integrating capacitor C is connected to the output terminals of the DACs 1 and 2. One end of the integrating capacitor C is grounded. The capacitor is electrically charged with the difference (I1~I2) between the currents I1 and I2. Whenever a clock is applied, the integrating capacitor C integrates the difference (I1~I2), and produces the result of the integration as a voltage value Vc. In FIG. 2, the voltage Vc from the capacitor C is delivered via a buffer 30.

The operation of the D/A converter circuit shown in FIG. 2 is next described by taking as an example the case in which a sinusoidal wave is generated.

To facilitate the understanding, it is assumed in the following description that the output frequency, or the frequency of the sinusoidal wave, is about 1/10 of the frequency of the timing signal CLK for conversion. In practicing the converter circuit according to the invention, the ratio of the output frequency to the timing signal clock (CLK) frequency can be changed for various applications, accordingly.

Figure 3A:
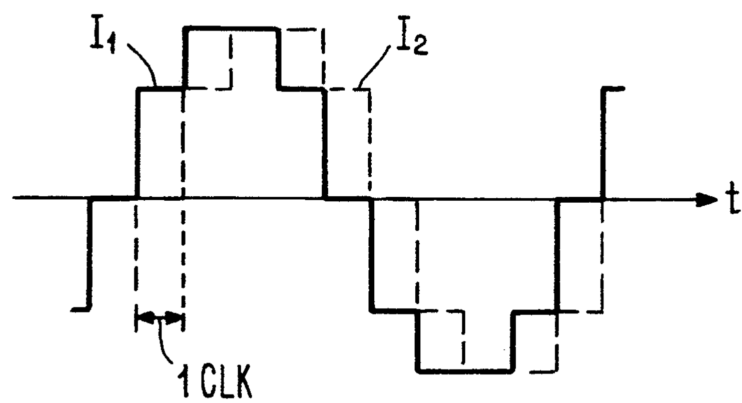
FIG. 3(A) is a diagram showing the output waveforms from the DACs shown in FIG. 2.

If the conversion timing signal CLK instructs DAC 1 and 2 to accept data, the n-th digital code D(n) is applied to the DAC 1, and the (n−1)th digital code D(n−1) is applied to the DAC 2. The DACs 1 and 2 produce analog currents $I_1$ and $-I_2$ in response to the digital inputs. As shown in FIG. 3(A), $I_1$ and $I_2$ are staircase waves. The phase of I2 is delayed with respect to I1 by one clock.

Figure 3B:
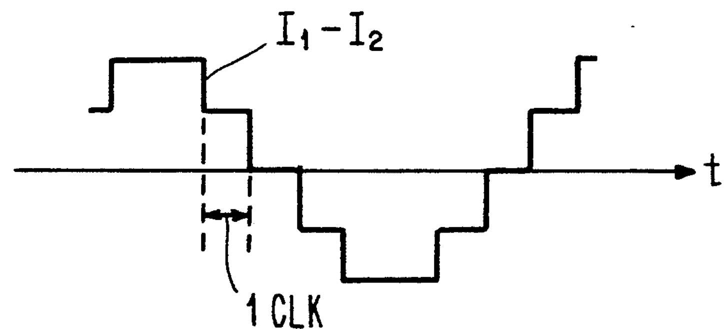
FIG. 3(B) is a diagram showing the difference between the outputs from the DACs.

FIG. 3(B) shows the difference $I_1-I_2$ with which the integrating capacitor C is electrically charged.

Assuming that the initial charging voltage for the capacitor C is 0, the voltage $V_c$ developed across the integrating capacitor C is given by $$V_c = \frac{1}{C}\int(I_1 - I_2)dt$$

During the period between successive clocks, I1–I2 is a constant current. Therefore, Vc varies with time during this period with an inclination determined by $(I_1-I_2)/C$.

Figure 4:
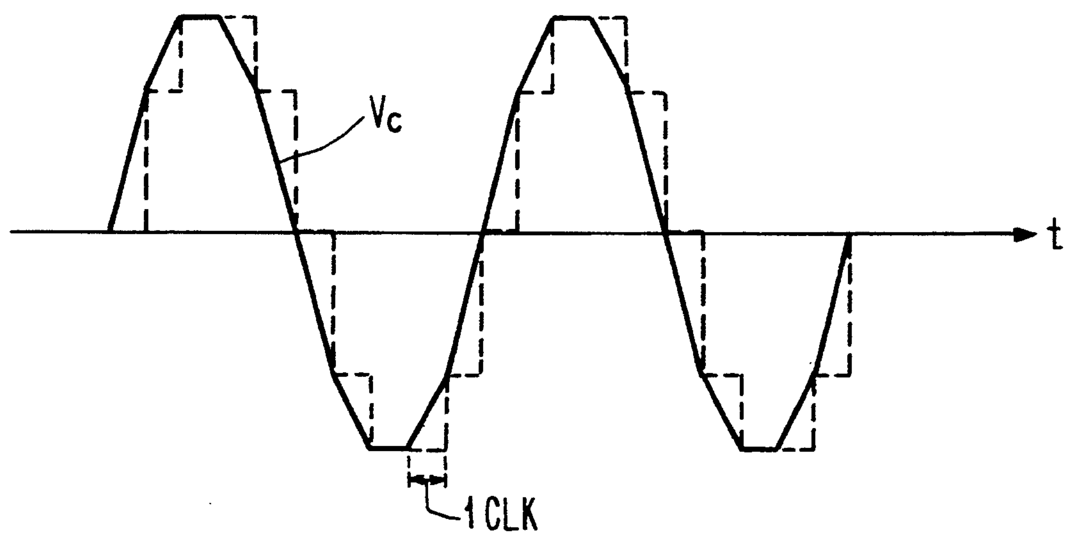
FIG. 4 is a waveform diagram showing the manner in which the integrating capacitor shown in FIG. 2 is electrically charged.

FIG. 4 is a diagram showing the above-described waveform $V_c$. As shown in this figure, a waveform close to a sinusoidal wave can be realized by successive waveforms of straight lines having successively varying inclinations. A waveform obtained by subjecting the output I1 from the DAC 1 to current-to-voltage conversion is drawn by broken lines, for reference. If the frequency of the timing signal CLK is set sufficiently higher than the frequency of the desired sinusoidal waveform output, then an output waveform that is almost identical with the sinusoidal wave can be attained.

In the example shown in FIG. 2, the D/A converter portion 10 is constructed from a pair of DACs. A smoother waveform can be accomplished by increasing the number of DACs and making the timing at which each DAC converts its input signal different between different DACs.

Figure 5:
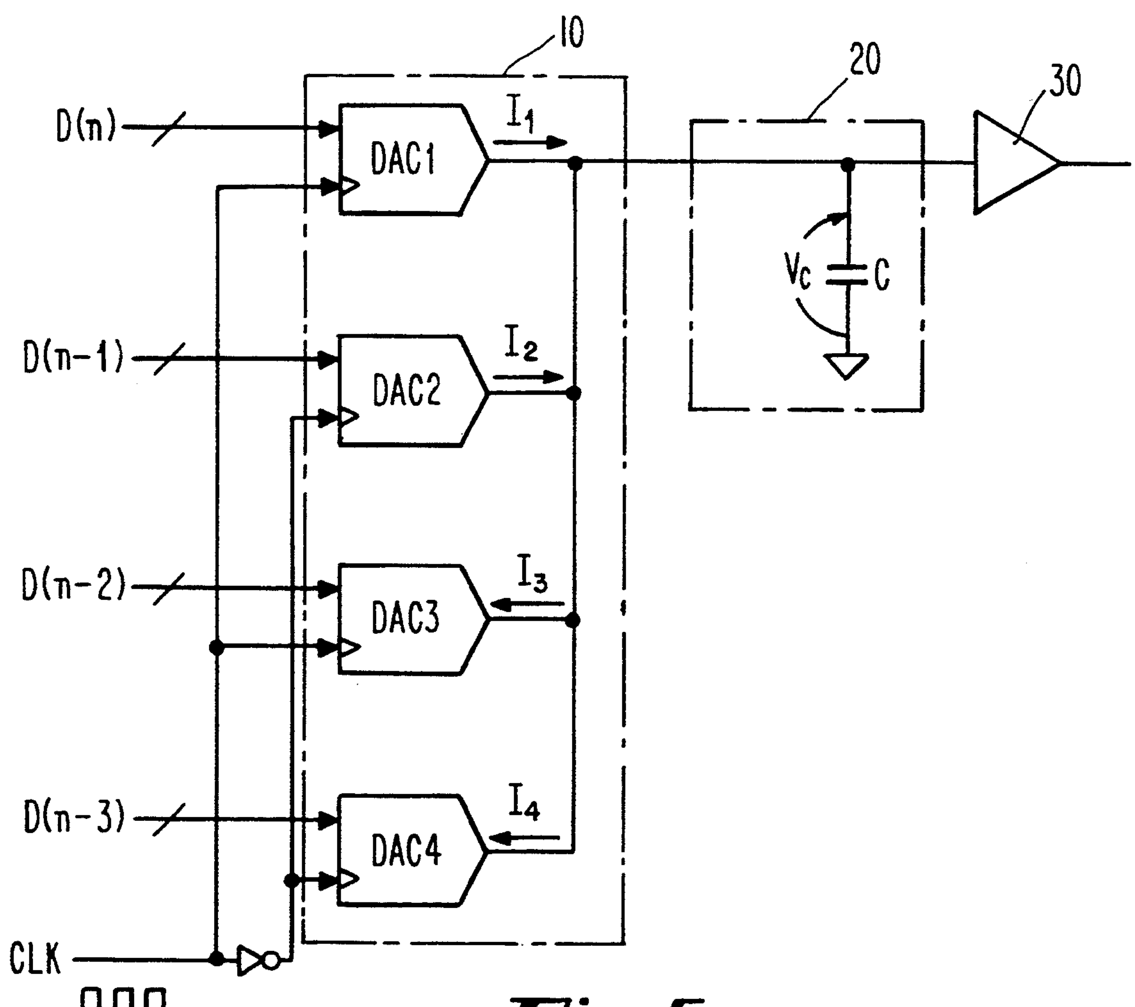
FIG. 5 is a diagram of an alternative converter circuit according to the invention.

FIG. 5 shows an example in which the D/A converter portion 10 is made up of four DACs 1–4. In the same way as in the example described in connection with FIG. 2, it is assumed that the directions of currents from the DACs do not always agree but that their other characteristics such as gain and offset are substantially coincident.

The n-th data code D(n), the (n−1)th data code D(n−1), the (n−2)th data code D(n−2), and the (n−3)th data code D(n−3) are applied to the DACs 1–4, respectively. In this figure, the timing signal CLK provides clock pulses having a duty cycle of 50%, it being noted that the duty cycle is not limited to 50%. On the leading edge of each clock, the DACs 1 and 3 accept their input data. On the trailing edge of each clock, the DACs 2 and 4 accept their input data. The DACs 1 and 2 produce positive analog currents 11 and 12, while the DACs 3 and 4 deliver negative analog currents −I3 and ~I4.

The operation of the D/A converter circuit shown in FIG. 5 is described by taking as an example the case in which a sinusoidal wave is produced.

Figure 6A:
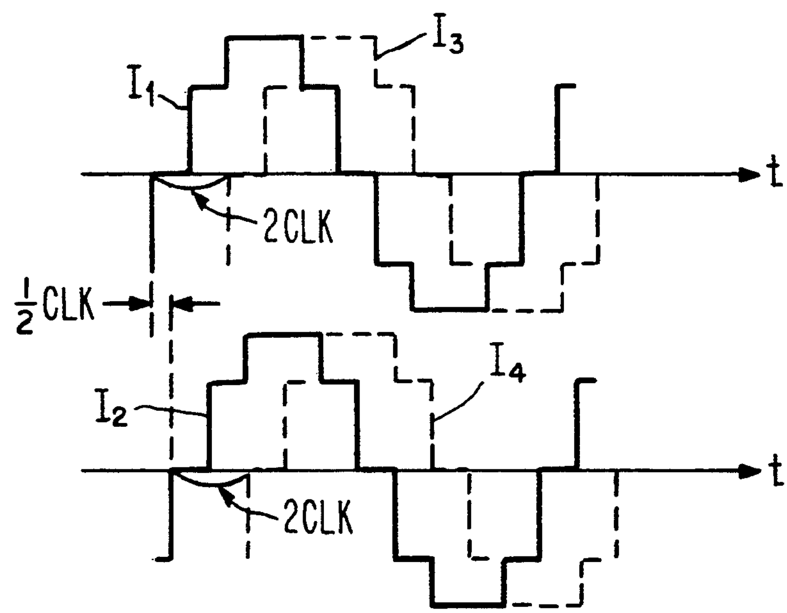
FIG. 6(A) is a diagram showing the output waveforms from the DACs shown in FIG. 5.

The leading edges of the timing signal CLK pulses cause the DACs 1 and 3 to accept digital codes, the n-th digital code D(n) and the (n−2)th digital code D(n−2) are applied to the DACs 1 and 3, respectively. In response to these digital input signals, the DACs 1 and 3 produce analog currents $I_1$ and $-I_3$. Currents $I_1$ and $I_3$ are staircase waves as shown in the graph drawn in the upper portion of FIG. 6(A). $I_3$ lags $I_1$ by 2 clocks.

Then, the trailing edges of the timing signal CLK pulses instructs the DACs 2 and 4 to accept digital codes. The (n−1)th digital code D(n−1) and the (n−3)th digital code D(n−3) are applied to the DACs 2 and 4, respectively. The DACs 2 and 4 deliver analog currents $I_2$ and $-I_4$ in response to these digital input signals. As shown in the lower portion of FIG. 6(A), $I_4$ lags $I_2$ by two clocks. $I_2$ lags $I_1$ by half of one clock.

Figure 6B:
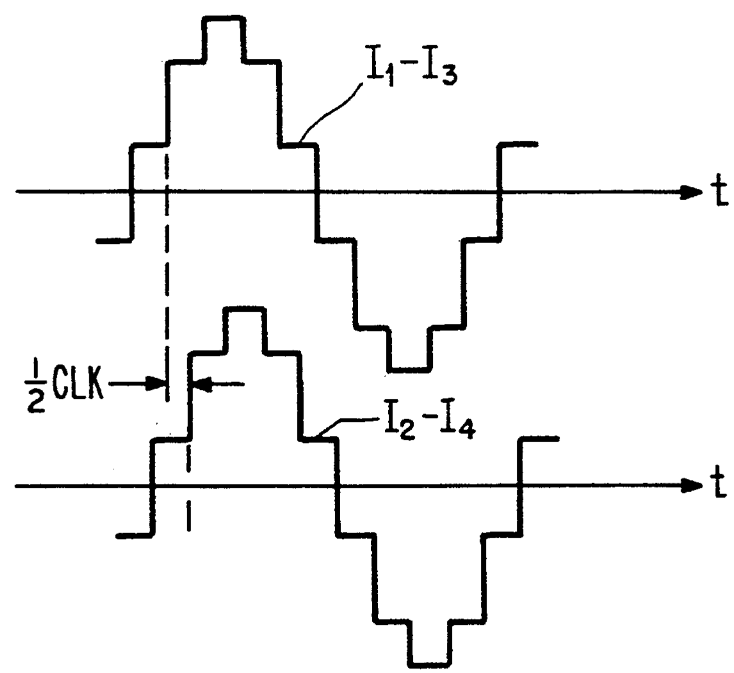
FIG. 6(B) is a diagram showing the waveform of the sum of the outputs from DACs 1 and 3, as well as the waveform of the sum of the outputs from DACs 2 and 4.

Variations in the current ($I_1-I_3$) and variations in the current ($I_2-I_4$) are shown in FIG. 6(B).

Figure 6C:
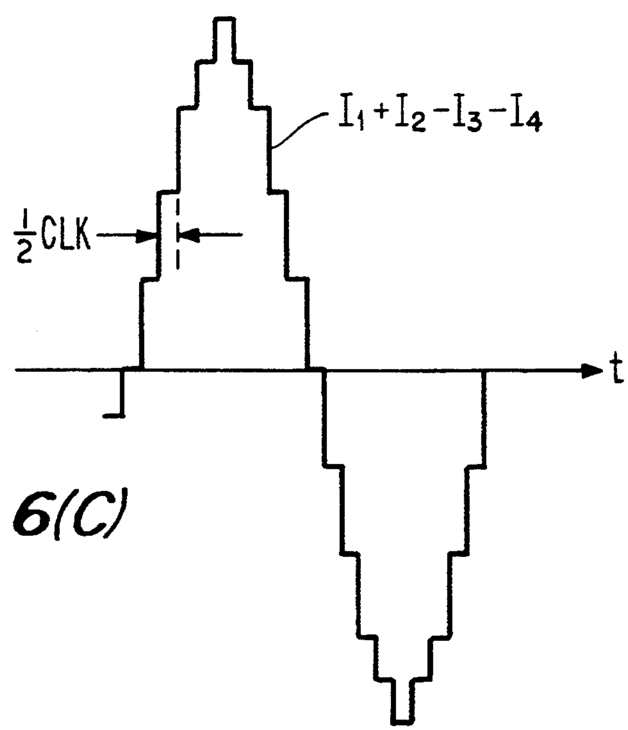
FIG. 6(C) is a diagram showing the waveform of the sum of the outputs from the DACs 1–4.

Variations in the current ($I_1+I_2-I_3-I_4$) are shown in FIG. 6(C).

Figure 6D:
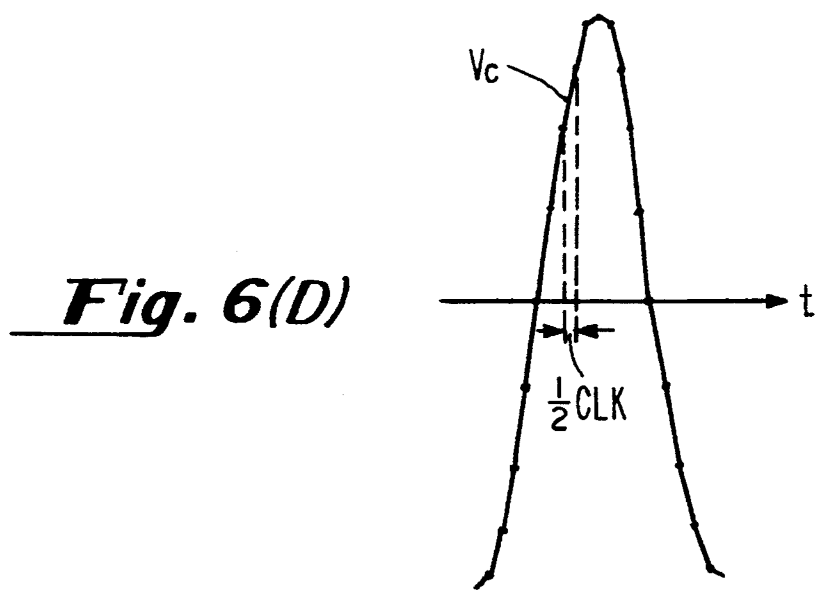
FIG. 6(D) is a diagram showing the manner in which the integrating capacitor shown in FIG. 5 is electrically charged.
Figure 6E:
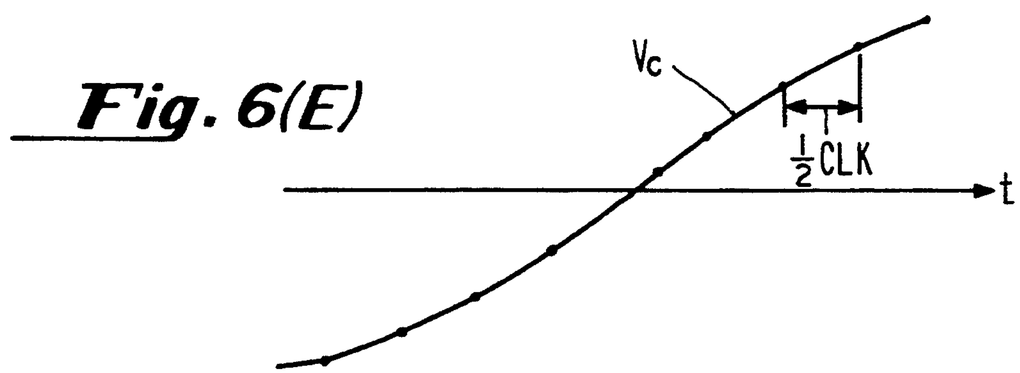
FIG. 6(E) is an enlarged diagram of FIG. 6(D)

The manner in which the integrating capacitor C is electrically charged is shown in FIG. 6(D) and 6(E). FIG. 6(E) is an enlarged graph of FIG. 6(D).

In this example, two curves which are shifted with respect to each other by half of the period of the timing signal's clock pulses are superimposed and so the time resolution is two times as high as the resolution of the circuit of FIG. 2. In addition, the obtained output voltages are connected together more smoothly, since the inclinations of the voltage changes occurring before and after an instant can be averaged out further.

In the above example, the sum $I_1-I_3$ of the output signals from the DACs 1 and 3 and the sum $I_2-I_4$ of the output signals from the DACs 2 and 4 are alternately applied to the integrating capacitor C. Other combinations are also possible as would be readily understood by those skilled in the art.

Figure 1:
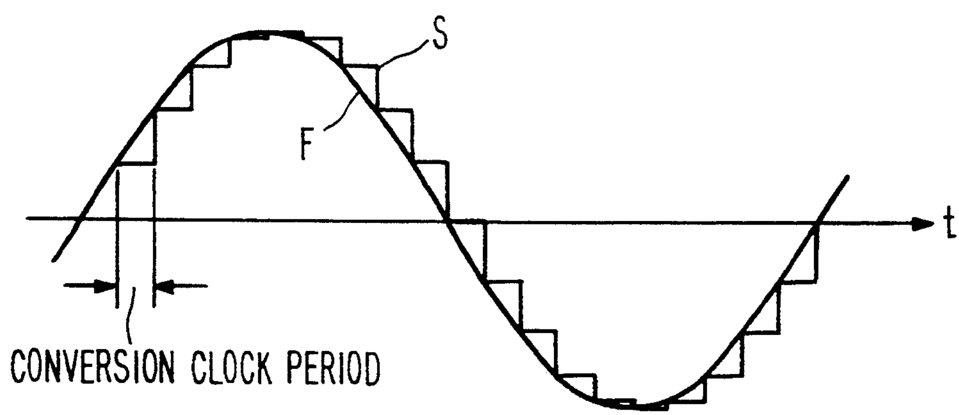
FIG. 1 is a diagram showing the output waveform which is obtained from the prior art DAC without a filter.
Figure 7A:
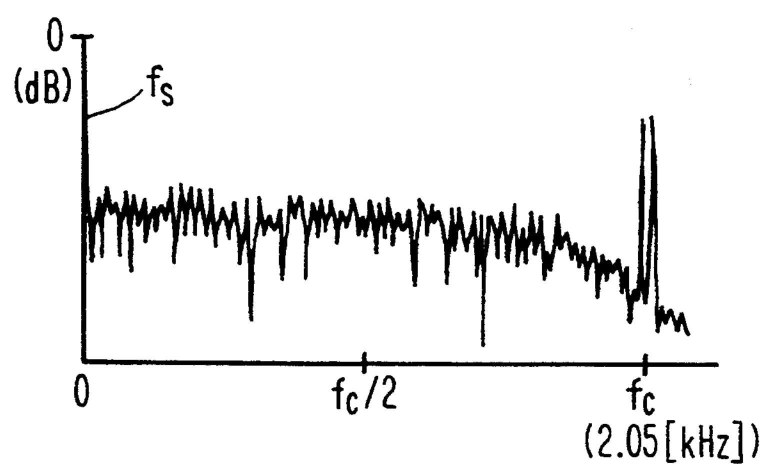
FIG. 7(A) is a diagram showing on the output spectrum of the waveform produced by a prior art circuit.
Figure 7B:
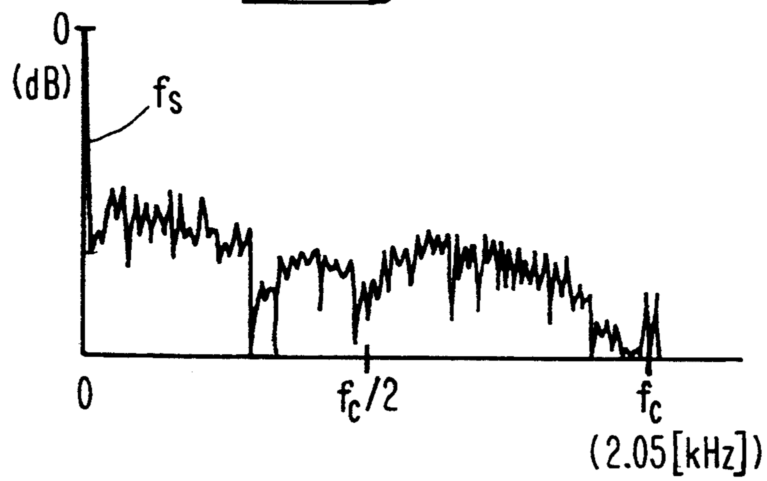
FIG. 7(B) is a diagram showing the output spectrum of the waveform by one embodiment of the converter circuit according to the invention.

FIG. 7(A) is a graph showing the result of a simulation made on the output frequency spectrum from the prior art D/A converter circuit. FIG. 7(B) is a graph showing the result of a simulation made on the frequency spectrum delivered from the novel D/A converter circuit shown in FIG. 5.

In FIG. 7(A) and 7(B), a sinusoidal wave of a frequency $f_S$ is produced and is sufficiently lower than the frequency $f_c$ (of about 2.05 kHz) of the timing signal CLK. In both cases, the signals are not passed through a low-pass filter. Each input digital code consists of 9 bits.

As can be seen by comparing FIG. 7(A) with FIG. 7(B), in the novel D/A converter circuit of FIG. 5, noise begins to decrease from the Nyquist frequency of $f_c/2$. This characteristic demonstrates that the effects of filtering have been realized without actually filtering the output.

The spurious components shown in FIG. 7(B) are sufficiently smaller than the spurious components shown in FIG. 7(A). This is another reason to dispense with a low-pass filter. Where a low-pass filter is used, high-frequency components can be attenuated greatly without using a filter having an exceptionally sharp cut-off frequency.

In the above examples, two or four DACs are employed in the D/A converter portion. The number of DACs can be increased up to 6, 8, and so on.

Also, an optimum interpolated wave can be generated by appropriately combining the latest digital input and plural digital inputs applied in the past to the DACs.

In the above description, the DACs used in the D/A converter portion produce output currents. DACs producing output voltages such as ladder resistance DACs can also be used. In this case, the analog amount is a voltage. As an example, a reactor is used as the integrating means. Where the integrating means consists of a reactor, the output is a current value.

The present invention yields numerous advantages. The following are some examples.

An analog output which consists of successive waveforms and is obtained by connecting straight lines having given inclinations during the periods between desired conversion clocks can be achieved. Hence, an output waveform which is close to the desired sinusoidal waveform and varies smoothly can be derived. Therefore, noise and unwanted spurious components in the high-frequency range (at least higher than the Nyquist frequency) can be reduced without using a low-pass filter requiring a sharp cut-off characteristic.

Where the frequency of the conversion clocks is not much higher than the frequency of the output waveform, at least noise in the frequency range higher than the Nyquist frequency can be eliminated by using a low-pass filter which is not required to have a sharp cut-off frequency.

Moreover, the D/A converter circuit itself can be made smaller in size and less expensive, because it is not necessary to use a low-pass filter or if a filter is used it can be a simple filter constructed with a small number of inexpensive components.

While the invention has been described and illustrated with reference to specific embodiments, those skilled in the art will recognize that modification and variations may be made without departing from the principles of the invention as described herein above and set forth in the following claims.

We claim:

1. A digital to analog circuit comprising:
 - a digital to analog converter portion for accepting digital inputs indicative of a signal level and for producing successive analog outputs, each analog output being indicative of a difference in signal level between at least one digital input and at least one previous digital input; and
 - an integrator coupled to the digital to analog converter portion for cumulatively integrating the successive analog outputs thereby producing a substantially smooth waveform.

2. The circuit of claim 1, wherein the digital to analog converter portion comprises a plurality of current source type digital to analog converters having a common output terminal, the analog output being indicative of the signal level difference between at least two digital inputs, and wherein the integrator comprises an integrating capacitor.

3. The circuit of claim 1, wherein the digital to analog portion further comprises:
 - a plurality of digital to analog converters, each digital to analog converter accepting a different digital input than any of the other digital to analog converters and converting the digital input so accepted to a corresponding analog signal.

4. The circuit of claim 3, wherein at least one of the corresponding analog signals is output from the digital to analog converter in reverse polarity.

5. The circuit of claim 3, further comprising:
 - a clock circuit coupled to the digital to analog converter portion for selectively enabling each digital to analog converter to accept one digital input.

6. The circuit of claim 3, wherein a number of corresponding analog signals are combined to produce each analog output.

7. A method of converting a digital waveform into a substantially smooth analog waveform comprising the steps of:
 - accepting a sequence of digital inputs defining the digital waveform:
 - converting each digital input into a corresponding sequence of analog outputs, each analog output having a signal level;
 - generating a difference signal indicative of a difference between the signal level of at least one analog output and the signal level of at least one previous analog output; and cumulatively integrating the difference signal thereby producing the substantially smooth analog waveform.

8. The method of claim 7, further comprising the steps of:

providing a clock signal having both rising and falling edges, at least some digital inputs being converted on the rising edges of the clock signal and at least some other digital inputs being converted on the falling edges of the clock signal, the difference signal being generated on each rising and each falling edge of the clock signal.

9. The method of claim 8, further comprising the steps of:

converting a current digital input and at least one previous digital input on the rising edge of the clock signal to produce a first set of analog outputs;

generating a first difference signal based on the first set of analog outputs:

converting a next digital input and at least one previous digital input on the falling edge of the clock circuit to produce a second set of analog outputs:

generating a second difference signal based on the second set of analog outputs; and combining the first and second difference signals resulting in a combined difference signal, the combined difference signal being cumulatively integrated.

* * * * *